United States Patent
Lee et al.

(10) Patent No.: US 8,762,901 B2
(45) Date of Patent: Jun. 24, 2014

(54) METHOD FOR PROCESS PROXIMITY CORRECTION

(71) Applicant: Samsung Electronics Co., Ltd, Suwon-Si (KR)

(72) Inventors: WonChan Lee, Suwon-si (KR); Seong-Bo Shim, Suwon-si (KR); Sunghoon Jang, Hwaseong-si (KR); Gun Huh, Gwangju (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/626,370

(22) Filed: Sep. 25, 2012

(65) Prior Publication Data
US 2013/0219349 A1    Aug. 22, 2013

(30) Foreign Application Priority Data
Feb. 22, 2012  (KR) ................. 10-2012-0018147

(51) Int. Cl.
   G06F 17/50  (2006.01)
(52) U.S. Cl.
   USPC .................................. 716/53; 716/54; 716/55
(58) Field of Classification Search
   USPC ............................................. 716/53, 54, 55
   See application file for complete search history.

(56) References Cited

U.S. PATENT DOCUMENTS

| | | | |
|---|---|---|---|
| 6,475,684 B2 | 11/2002 | Ki | |
| 7,735,053 B2 | 6/2010 | Harazaki | |
| 7,849,423 B1 * | 12/2010 | Yenikaya et al. | 716/132 |
| 2002/0051916 A1 | 5/2002 | Ki | |
| 2008/0003510 A1 | 1/2008 | Harazaki | |
| 2009/0117344 A1 | 5/2009 | Tamura | |
| 2011/0224945 A1 | 9/2011 | Shim et al. | |

FOREIGN PATENT DOCUMENTS

| | | |
|---|---|---|
| JP | 2004341158 A | 12/2004 |
| JP | 4059397 B2 | 3/2008 |
| JP | 2010232542 A | 10/2010 |
| KR | 100567761 B1 | 4/2006 |
| KR | 100871750 B1 | 12/2008 |
| KR | 20090071736 A | 7/2009 |

* cited by examiner

*Primary Examiner* — Thuan Do
*Assistant Examiner* — Magid Dimyan
(74) *Attorney, Agent, or Firm* — Harness, Dickey & Pierce, P.L.C.

(57) ABSTRACT

A method for process proximity correction may include obtaining a point spread function (PSF) from test patterns, the test patterns including an etching process performed thereon, generating a target layout with polygonal patterns, dividing the target layout into grid cells, generating a density map including long-range layout densities, each of the long-range layout densities being obtained from the polygonal patterns located within a corresponding one of the grid cells, performing a convolution of the long-range layout densities with the PSF to obtain long-range etch skews for the grid cells, and generating an etch bias model including short-range etch skews and the long-range etch skews, each of the short-range etch skews being obtained from a neighboring region of a target pattern selected from the polygonal patterns in each of the grid cells.

16 Claims, 8 Drawing Sheets

METHOD FOR PROCESS PROXIMITY CORRECTION

CROSS-REFERENCE TO RELATED APPLICATIONS

This U.S. non-provisional patent application claims priority under 35 U.S.C. §119 to Korean Patent Application No. 10-2012-0018147, filed on Feb. 22, 2012, in the Korean Intellectual Property Office, the entire contents of which are hereby incorporated by reference.

BACKGROUND

1. Field

Example embodiments of the inventive concepts relate to a method of designing a photomask layout, and in particular, to a method for process proximity correction, which may be performed on a target layout.

2. Description of the Related Art

With the development of photolithography technology, a scale reduction of an integrated circuit is accelerating further. For example, a pattern transferred onto a wafer may have a width less than a wavelength of an exposed beam. Accordingly, an optical proximity correction (OPC) for correcting pattern deformation caused by optical problems is recognized as being necessary to form a fine pattern having further accuracy and reliability. As fine patterns are adjacent to each other, requirements of process proximity correction for minimizing or reducing pattern deformation in an etching process are being increased along with the OPC process.

The conventional method for process proximity correction is performed on the basis of an etch bias model including information on density of neighboring patterns that are disposed in a range of several ten to several hundred nanometers around a target pattern. However, the conventional method for process proximity correction has suffered from relatively low accuracy.

SUMMARY

Example embodiments of the inventive concepts provide a method for process proximity correction capable of generating an etch bias model with relatively high accuracy.

Example embodiments of the inventive concepts also provide a method capable of increasing productivity of a process proximity correction.

According to example embodiments, a method for process proximity correction may include obtaining a point spread function (PSF) from test patterns, the test patterns including an etching process performed thereon, generating a target layout with polygonal patterns, dividing the target layout into grid cells, generating a density map including long-range layout densities, each of the long-range layout densities being obtained from the polygonal patterns located within a corresponding one of the grid cells, performing a convolution of the long-range layout densities with the PSF to obtain long-range etch skews for the grid cells, and generating an etch bias model including short-range etch skews and the long-range etch skews, each of the short-range etch skews being obtained from a neighboring region of a target pattern selected from the polygonal patterns in each of the grid cells.

In example embodiments, raster densities are generated in the density map. In example embodiments, the PSF is obtained in terms of a long-range kernel function. In example embodiments, the long-range kernel function may be obtained in terms of at least one of a non-Gaussian function and an abnormal distribution function.

In example embodiments, the long-range kernel function and the long-range layout densities are calculated in micrometers. In example embodiments, the short-range skews may be obtained by convolution of short-range layout densities with a short-range kernel function in the neighboring region of the target pattern. In example embodiments, the short-range layout densities and the short-range kernel function may be obtained in nanometers.

In example embodiments, the short-range kernel function may be obtained in terms of at least one of a Gaussian function, a normal distribution function, and a circle function. In example embodiments, obtaining the short-range etch skews may include performing a convolution of the short-range kernel function with one of a visible area and a block area. In example embodiments, each of the grid cells may be larger than the neighboring region of the target pattern.

In example embodiments, generating the etch bias model may further include selecting the target pattern for each of the grid cells, selecting a reference point from an edge of the target pattern, setting the reference point at a center of the neighboring region, obtaining a short-range etch skew in the neighboring region, and obtaining an etch skew based on a combination of the short-range etch skew and the long-range etch skew.

According to example embodiments, a method for process proximity correction may include performing an etching process to provide test patterns with first long-range layout densities, comparing the first long-range layout densities of the test patterns to obtain first long-range etch skews, obtaining a point spread function (PSF) of the first long-range layout densities from the first long-range etch skews, generating a target layout with polygonal patterns, dividing the target layout into grid cells, generating a density map including second long-range layout densities, each of the second long-range layout densities being obtained from the polygonal patterns located within a corresponding one of the grid cells, performing a convolution of the second long-range layout densities and the PSF to obtain second long-range etch skews for the grid cells, and generating an etch bias model including short-range etch skews and the second long-range etch skews, each of the short-range etch skews being obtained from a neighboring region of a target pattern selected from the polygonal patterns in each of the grid cells.

In example embodiments, each of the test patterns may have a central pattern and an outer pattern around the central pattern, and the central pattern of each of the test patterns may have a same size and the outer pattern of each of the test patterns may have different sizes from each other. In example embodiments, a space may be provided between the grid cells substantially equal to that between the central patterns. In example embodiments, the etching process may provide central and outer patterns including line patterns and a space between the line patterns of the central patterns may be substantially equal to that of the outer patterns.

According to example embodiments, a method for process proximity correction may include obtaining a point spread function (PSF) from test patterns, generating a target layout with polygonal patterns, dividing the target layout into grid cells, generating a density map including long-range layout densities, performing a convolution of the long-range layout densities with the PSF to obtain long-range etch skews for the grid cells, the long-range etch skews being calculated in micrometers, and generating an etch bias model including short-range etch skews and the long-range etch skews.

In example embodiments, the PSF may be obtained in terms of a long-range kernel function. In example embodiments, the long-range kernel function may be obtained in terms of at least one of a non-Gaussian function and an abnormal distribution function. In example embodiments, the short-range etch skews may be obtained by convolution of short-range layout densities with a short-range kernel function in the neighboring region of the target pattern. In example embodiments, the short-range layout densities and the short-range kernel function may be obtained in nanometers.

BRIEF DESCRIPTION OF THE DRAWINGS

Example embodiments will be more clearly understood from the following brief description taken in conjunction with the accompanying drawings. FIGS. 1 through 8 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
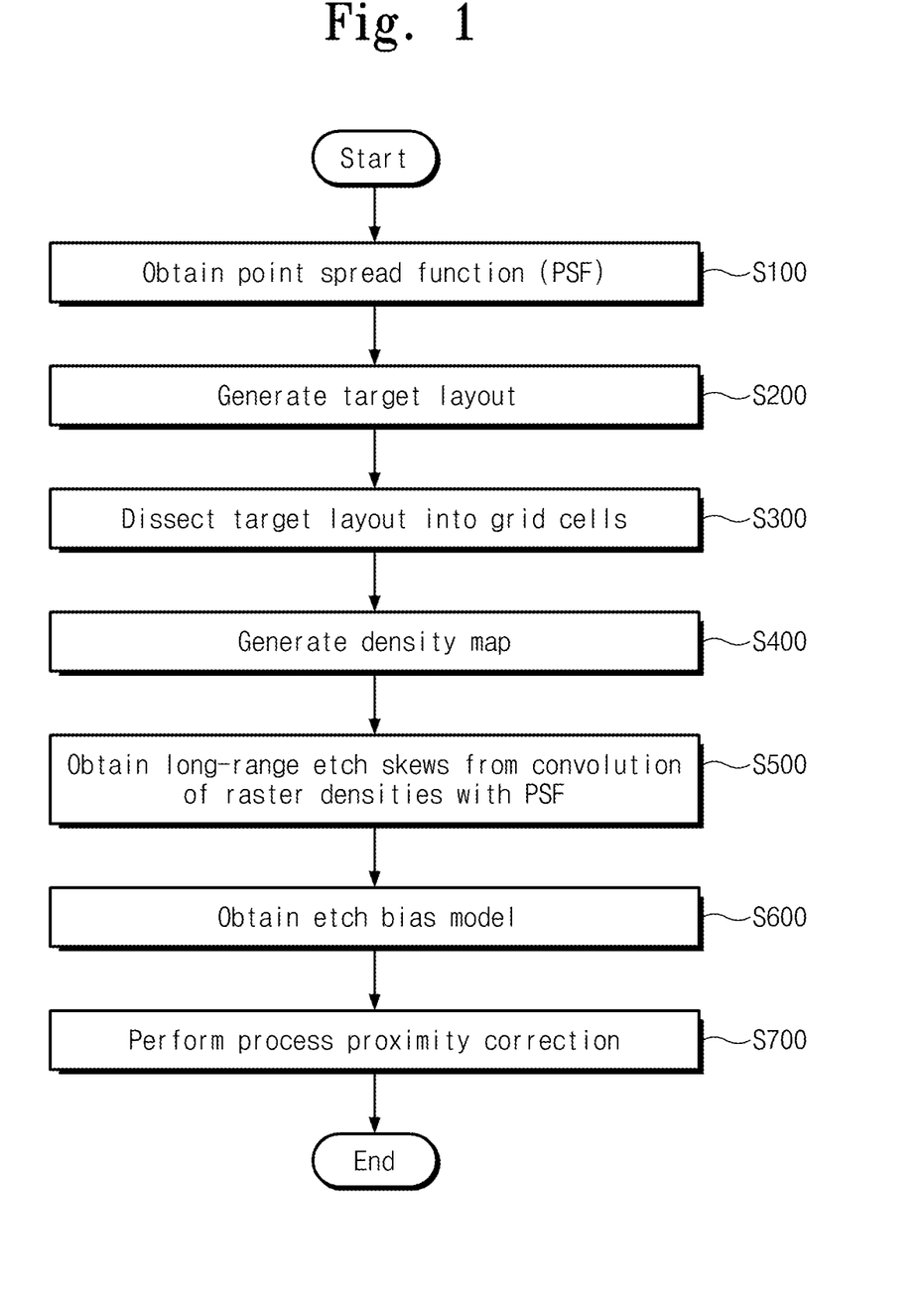
FIG. 1 is a flow chart illustrating a process proximity correction according to example embodiments of the inventive concepts.
Figure 2:
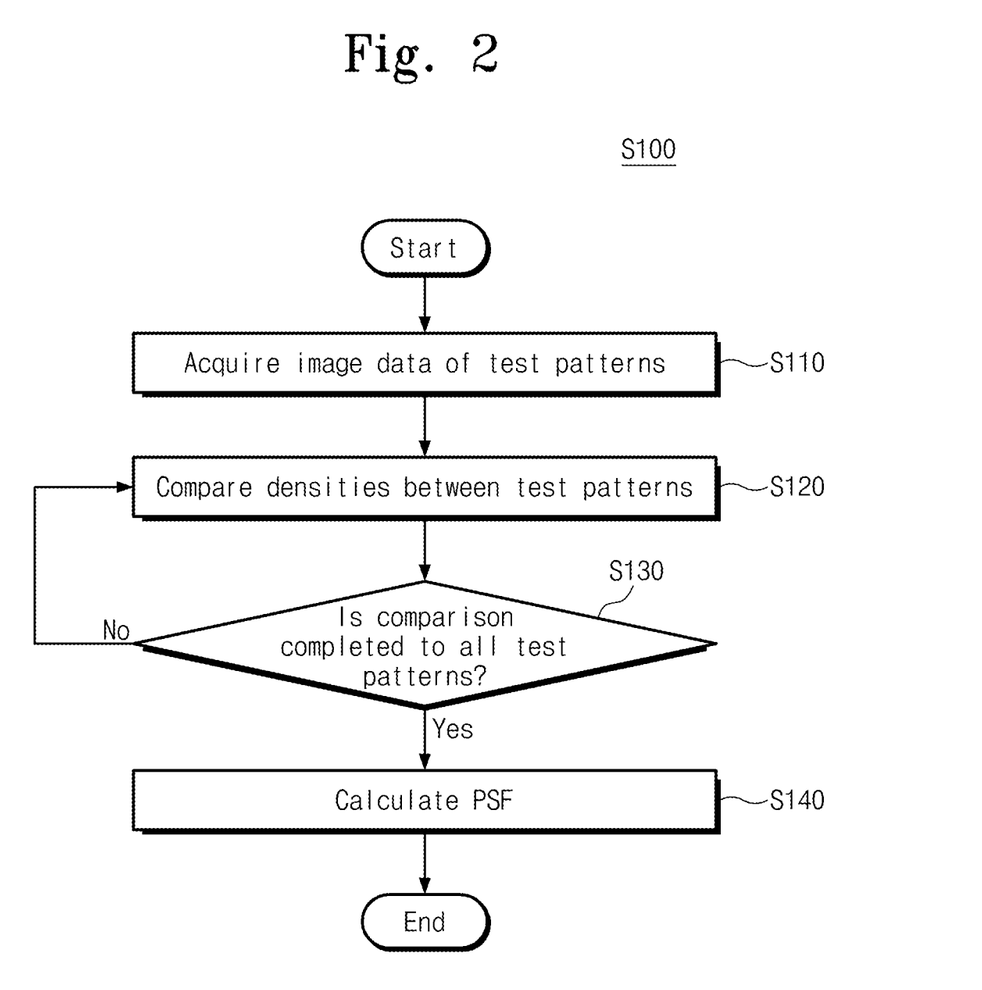
FIG. 2 is a detailed flow chart of a PSF extraction step of FIG. 1.
Figure 3:
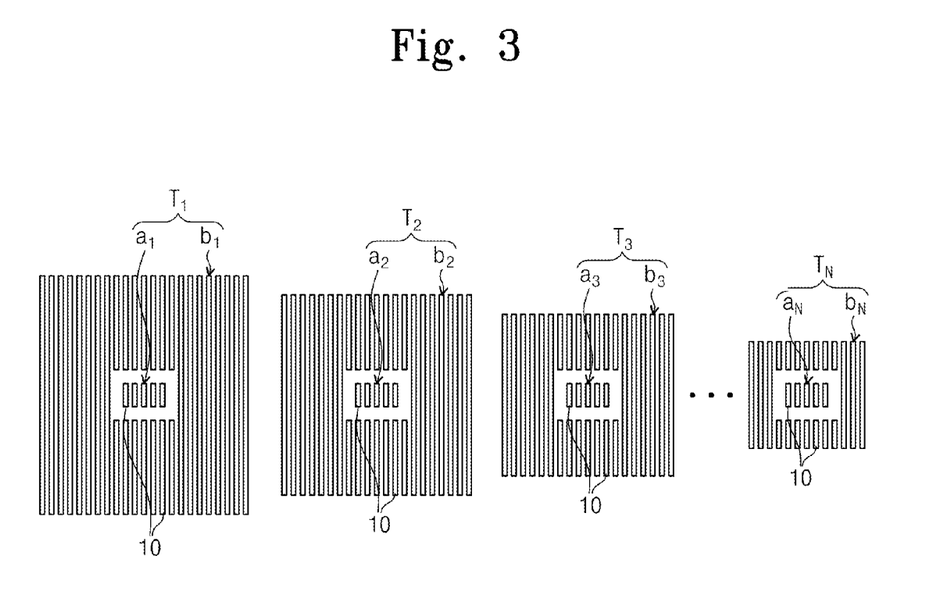
FIG. 3 is a plan view illustrating images of test patterns according to example embodiments of the inventive concepts.

FIG. 1 is a flow chart illustrating a process proximity correction according to example embodiments of the inventive concepts and FIG. 2 is a detailed flow chart of a PSF extraction step of FIG. 1. FIG. 3 is a plan view illustrating images of test patterns according to example embodiments of the inventive concepts.

Referring to FIGS. 1 through 3, a point spread function (PSF) for a specific etching process may be obtained from first to n-th test patterns T1, T2, T3, . . . , and Tn (in S100). The PSF may include a long-range kernel function. The PSF may be a function capable of estimating a rate of change of a long-range etch skew with respect to a change of a long-range layout density, for neighboring patterns provided spaced apart from a reference position of a measuring object during the specific etching process (e.g., for polygonal patterns 20 of FIG. 5 around a reference point 50 of FIG. 8). In example embodiments, patterns spaced apart by several micrometers from the reference position may be considered as the neighboring patterns. In other words, the PSF may represent correlation between the long-range etch skew and the long-range layout densities at a reference position. For example, the PSF may be obtained from the first to n-th test patterns T1-Tn, on which the specific etching process has finished. The first to n-th test patterns T1-Tn may be formed to include information on variation of the long-range etch skew in the etching process. This will be described in more detail below.

Image data of the first to n-th test patterns T1-Tn may be acquired (in S110). The first to n-th test patterns T1-Tn may include first to n-th central patterns a1, a2, a3, . . . , and first to n-th outer patterns b1, b2, b3, . . . , and bn, respectively, where the first to n-th central patterns a1-an may have the same size and the first to n-th outer patterns b1-bn may be disposed around the first to n-th central patterns a1-an to have different sizes from each other (e.g., gradually decreasing sizes). The first to n-th central patterns a1-an and the first to n-th outer patterns b1-bn may include sub-patterns 10. In example embodiments, each of the sub-patterns 10 may be shaped like a rectangular or linear pattern. Each of the sub-patterns 10 may have a width ranging from about 1 nm to about 100 nm, and a space between the sub-patterns 10 may range from about 1 nm to about 100 nm. Although not shown, the number of the first to n-th test patterns T1-Tn may be modified according to a shape of the sub-pattern 10.

The first to n-th central patterns a1-an may be spaced apart by a relatively long distance (e.g., at least 1 μm or more) from the first to n-th outer patterns b1-bn, respectively. In example embodiments, the first to n-th central patterns a1-an may be disposed within rectangular regions having a width of about 2 μm, while the first to n-th outer patterns b1-bn may be disposed within rectangular regions, respectively, whose half widths gradually decreases from about 10 mm to about 2 μm. In example embodiments, half widths of the first to n-th outer patterns b1-bn may decrease by about 2 μm in a stepwise manner. For example, the first outer pattern b1 may have a half width of 10 mm, while the second outer pattern b2 may have a half width of 9,988 μm.

Thereafter, the first to n-th test patterns T1-Tn may be sequentially compared with each other to obtain variation or change in the long-range etch skew thereof (in S120). For example, a difference in long-range etch skew between the first test pattern T1 and the second test pattern T2 may be calculated. In addition, a difference in long-range etch skew between the second test pattern T2 and the third test pattern T3 may be calculated. The differences in the long-range etch skew may be different from each other due to the difference in size of the first to n-th outer patterns b1-bn. As a result, the first to n-th central patterns a1-an may include information on variation in the long-range etch skew caused by the difference in size between the first to n-th outer patterns b1-bn. The first to n-th outer patterns b1-bn may have first long-range layout densities which may be different from each other with respect to the first to n-th central patterns a1-an. Accordingly, the variation of the long-range etch skew in the specific etching process may be represented in terms of variation in the first long-range layout density. The variation in the long-range etch skews may correspond to a change amount of the long-range etch skew.

It may be checked whether comparison of the first to n-th test patterns T1-Tn has been completed (in S130). As the result of the comparison of the first to n-th test patterns T1-Tn, obtaining several long-range etch skews and several first long-range layout densities may be possible.

The PSF may be calculated from variation in the long-range etch skew of the first to n-th test patterns T1-Tn (in S140). The PSF may include information on differences in long-range etch skew between the first to n-th test patterns T1-Tn. As described above, the PSF may include the long-range kernel function. The long-range kernel function may be given by non-Gaussian function or abnormal distribution function. For example, the PSF may be expressed by a product of an inverse function of distance (1/r) and a Gaussian distribution function, as follows:

$$K(x, y) = \frac{1}{\sqrt{x^2 + y^2}} e^{-((x-b_1)^2/2\sigma_1^2 + (y-b_2)^3/2\sigma_2^2)} \quad \text{[Equation 1]}$$

where K(x, y) is a long-range layout density at a point described by rectangular coordinates x and y. The rectangular coordinates x and y may have a scale of relatively long range (e.g., an order of micrometer (μm)). In addition, b1, b2, σ1, and σ2 are constants. In the case where the PSF increases or decrease isotropically according to a moving distance corresponding to the rectangular coordinates x and y, σ1 and σ2 may be the same constant value. As a result, the PSF may include a long-range kernel function representing a change in the long-range etch skew at the rectangular coordinates x and y. Furthermore, accuracy of the PSF may be improved when the etching process on the first to n-th test patterns T1-Tn is repeatedly performed and a process including steps S110-S140 is repeatedly performed.

Figure 4:
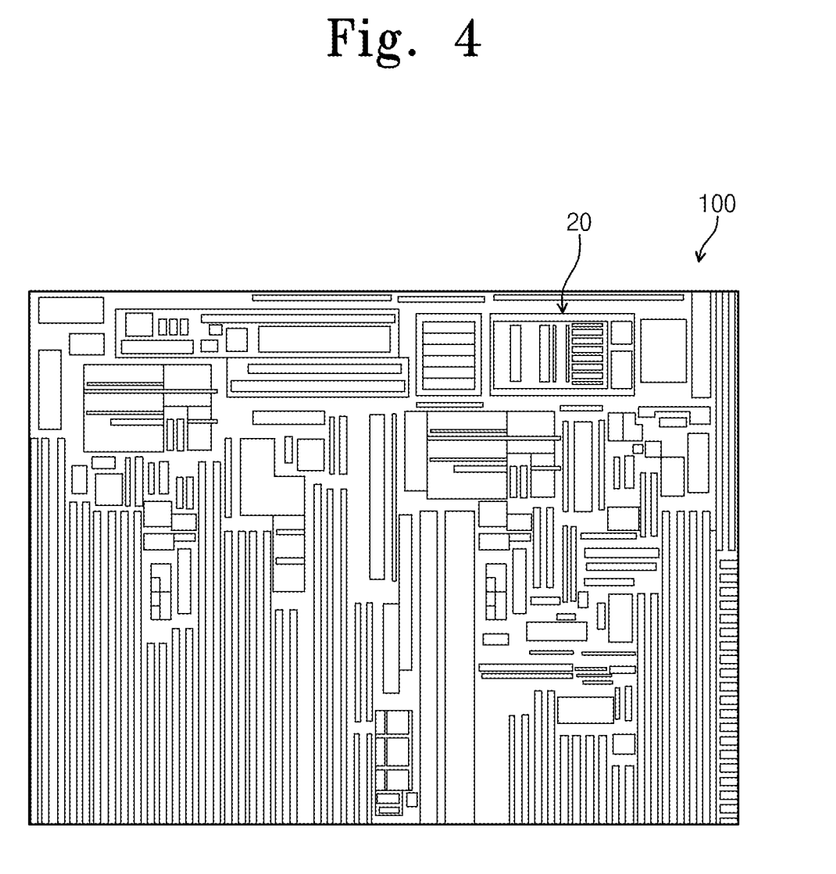
FIG. 4 is a plan view illustrating an example of a target layout according to example embodiments of the inventive concepts.

FIG. 4 is a plan view illustrating an example of a target layout according to example embodiments of the inventive concepts. Referring to FIGS. 1 and 4, a target layout 100 may be generated (in S200). The target layout 100 may be prepared to span an area corresponding to a single shot. In example embodiments, the target layout 100 may include polygonal patterns 20 arranged to form a line and space structure.

Figure 5:
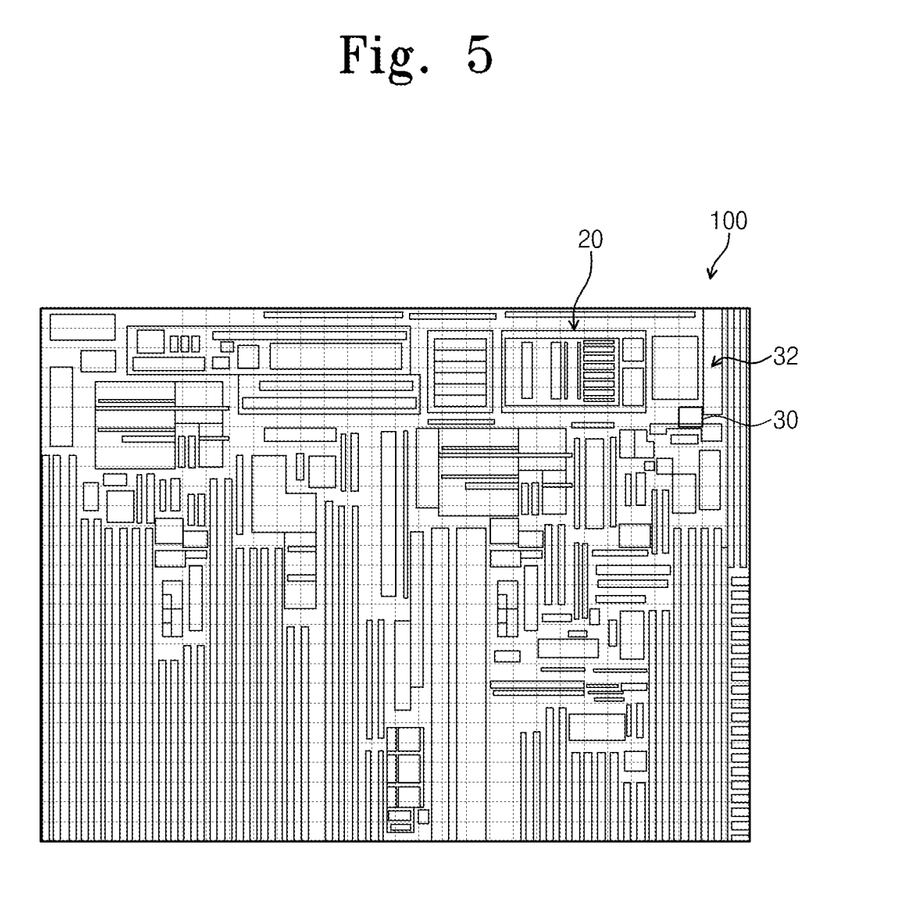
FIG. 5 is a plan view illustrating an example of a grid on the target layout according to example embodiments of the inventive concepts.

FIG. 5 is a plan view illustrating an example of a grid on the target layout according to example embodiments of the inventive concepts. Referring to FIGS. 1, 3, 5, and 6, the target layout 100 may be divided into grid cells 30 by a grid 32 (in S300). The grid cells 30 may be regularly arranged to span the whole region of the target layout 100. The grid cells 30 may be arranged to have the same space as that of the first to n-th central patterns a1-an of the test patterns. For example, the grid cells 30 may be arranged to have a space of about 2 μm and each of them may be shaped like a square.

Figure 6:
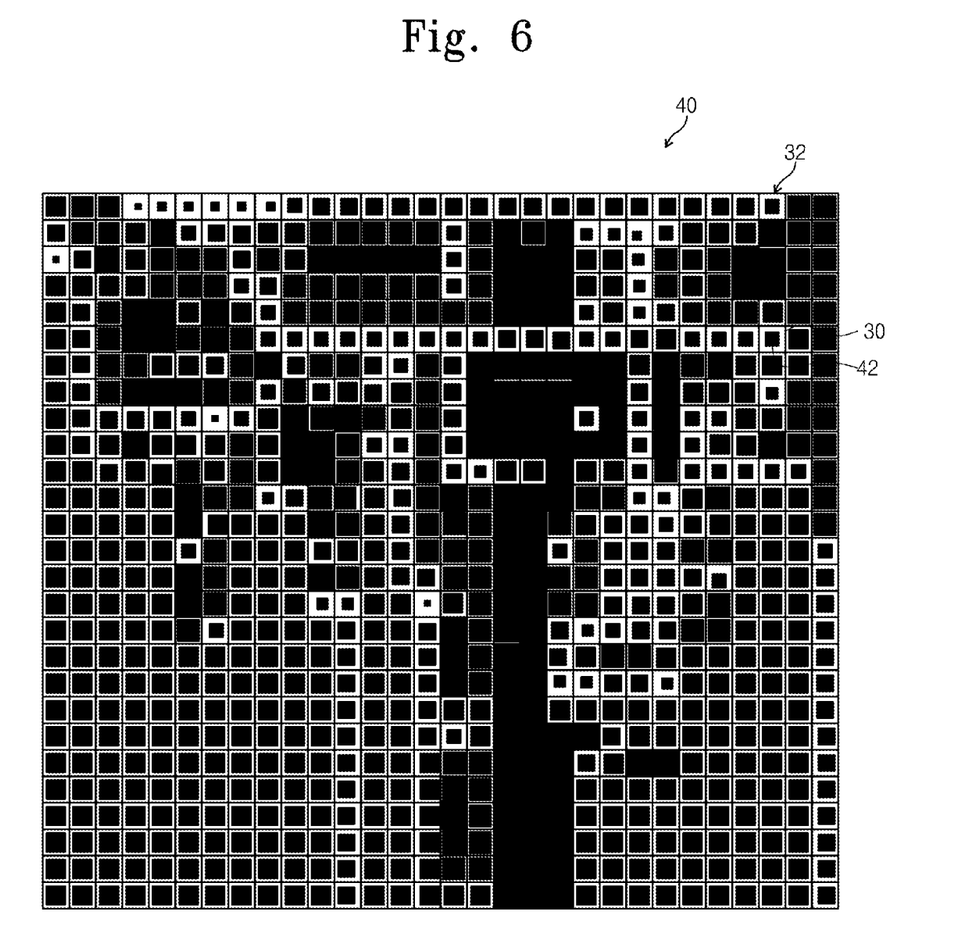
FIG. 6 is a plan view illustrating an example of a density map according to example embodiments of the inventive concepts.

FIG. 6 is a plan view illustrating an example of a density map according to example embodiments of the inventive concepts. Referring to FIGS. 1, 3, and 6, a density map 40 may be generated (in S400). The density map 40 may include raster densities 42, each of which is given for the corresponding one of the grid cells 30. Each of the raster densities 42 may be a second long-range layout density of the polygonal patterns 20 in the corresponding one of the grid cells 30. In addition, the second long-range layout densities may correspond to the first long-range layout densities etch other. The raster densities 42 may be values obtained from centers of the grid cells 30. The raster densities 42 may be expressed in the form of "R(x, y)" using orthogonal coordinates x and y of the corresponding grid 32.

Figure 7:
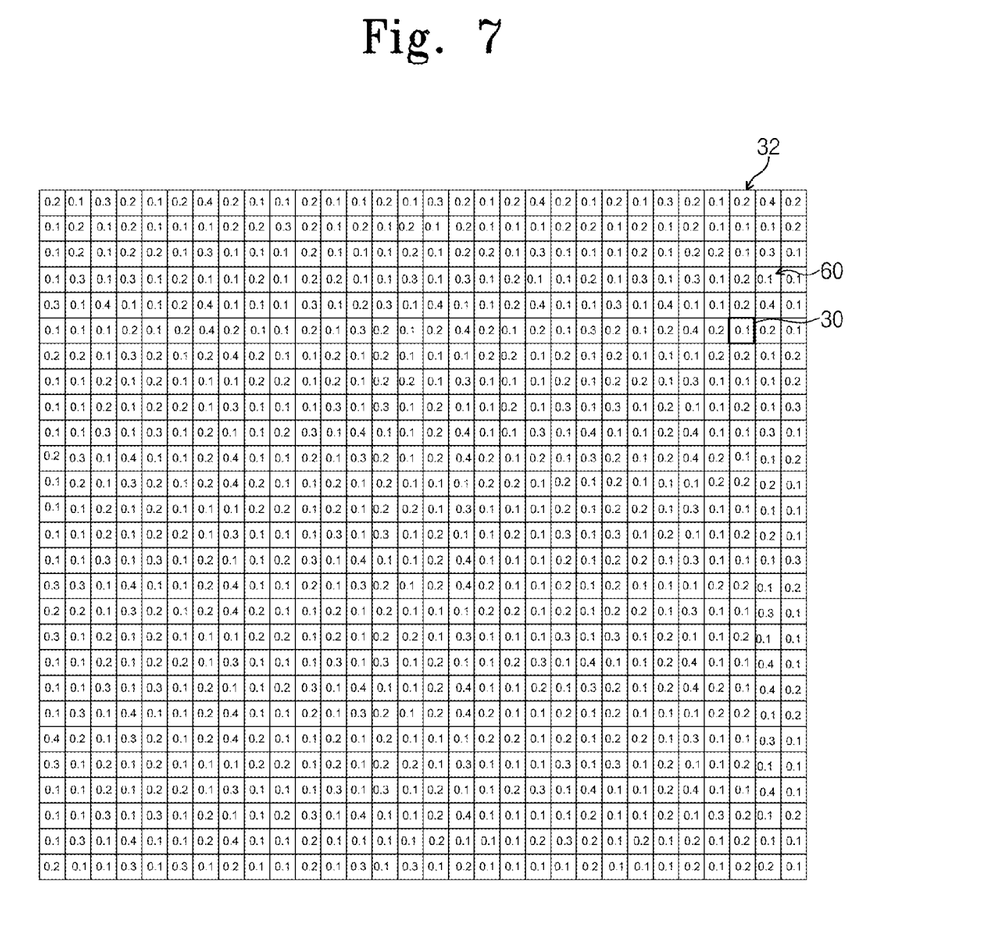
FIG. 7 is a plan view illustrating long-range etch skews in the density map according to example embodiments of the inventive concepts.

FIG. 7 is a plan view illustrating long-range etch skews in the density map according to example embodiments of the inventive concepts. Referring to FIGS. 1, 6 and 7, long-range etch skews 60 at the grid cells 30 may be calculated by convolution of the raster densities 42 and the PSF (in S500). Each of the long-range etch skews 60 may be expressed as an element in a matrix, which corresponds to the grid cells 30 in a one-to-one manner and be given by a numerical value. The number of the long-range etch skews 60 may be the same as that of the grid cells 30. In example embodiments, the long-range etch skews 60 may be given by the following equation 2.

$$Dl(x,y)=\iint R(x,y) \times K(x,y) dx dy \quad \text{[Equation 2]}$$

where $Dl(x, y)$ represents a long-range etch skew at one of the grid cells 30 with coordinates x and y. $R(x, y)$ is a raster density at one of the grid cells 30 with coordinates x and y. $K(x, y)$ is a PSF at one of the grid cells 30 with coordinates x and y and is a factor affecting a second long-range layout density or a raster density at one of the grid cells 30 with coordinates x and y. In other words, the long-range etch skew $Dl(x, y)$ at one of the grid cells 30 with coordinates x and y may be calculated by convolution of the PSF and the raster density 42. Here, the convolution may be obtained by a surface integral with respect to dx and dy.

Figure 8:
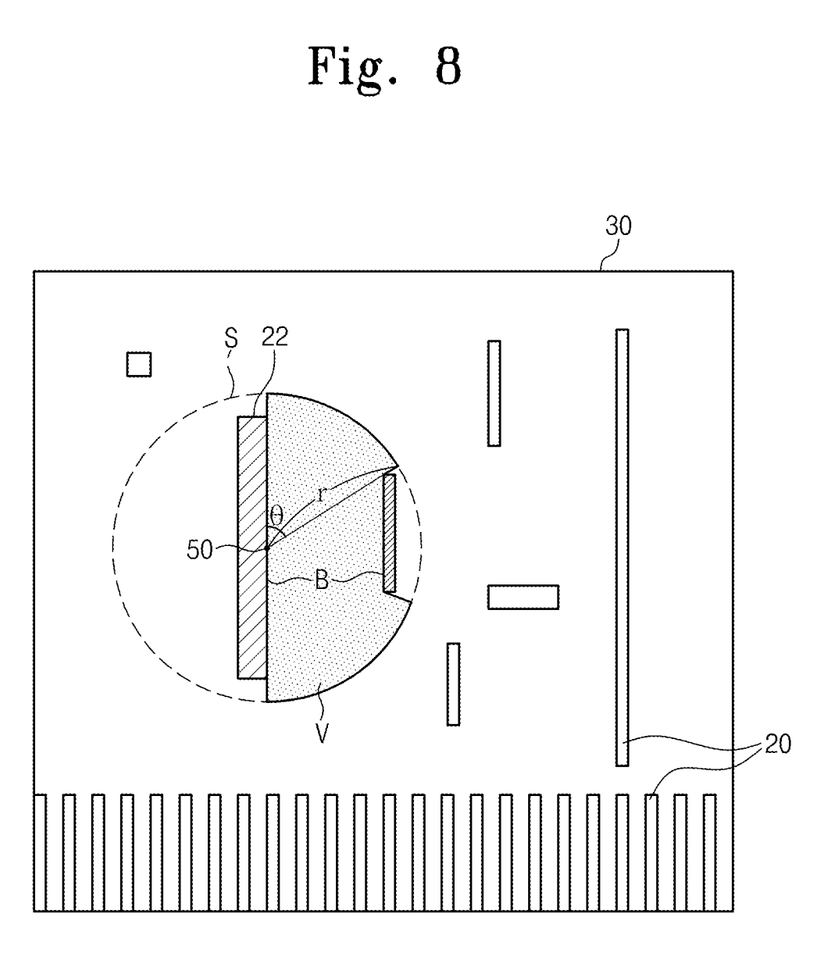
FIG. 8 is an enlarged plan view illustrating polygonal patterns in a grid cell of FIG. 5.

FIG. 8 is an enlarged plan view illustrating polygonal patterns in a grid cell of FIG. 5. Referring to FIGS. 1 through 8, an etch bias model including the long-range etch skew 60 may be obtained (in S600). The etch bias model may enable to predict a difference between a local etching bias and a global etch bias, which may occur during an etching process. The etch bias model may be represented in terms of etching bias values. The etch skew in the etch bias model may be given by a combination of the short-range etch skew and the long-range etch skew. The etch skew may be calculated from a target pattern 22, which may be one of the polygonal patterns 20 provided in the grid cells 30. The etch skew or etching bias may represent an etching property at an edge of the target pattern 22. For example, the etch skew or etching bias may represent a difference between designed and etched widths of the target pattern 22. The etch skew or etching bias may be calculated at a reference point 50, which may be selected from an edge of the target pattern 22. If the etch skew is positive, the reference point 50 may be moved toward a center of the target pattern 22 which means that a width of the target pattern 22 is decreased. If the etch skew is negative, the reference point 50 may be moved radially from the center of the target pattern 22 toward the outside, which means that the width of the target pattern 22 is increased.

As described above, the etch skew may be given in terms of the long-range etch skew. For example, the following equations 3 and 4 may be used to represent the etch skew according to example embodiments of the inventive concepts.

$$b = c_0 + \sum_{i=1}^{m} c_i D_i(r_i, \theta_i, x, y) + c_l D_l(x, y), \text{ and} \quad \text{[Equation 3]}$$

$$b = c_0 + \sum_{i=1}^{m} c_i D_i(r_i, \theta_i, x, y) + c_l D_l(x, y). \quad \text{[Equation 4]}$$

In the equations 3 and 4, b is an etch skew at the reference point 50, and C0 is a constant. $D_i(r_i, \theta_i, x, y)$ is a short-range etch skew, which may be dependent on, for example, a visible area, a block area, and/or a short-range layout density, at a neighboring region S around the reference point 50. $Dl(x, y)$ is a long-range etch skew at a point with long range orthogonal coordinates x and y. $c_i$ is a short-range weighting and $c_l$ is a long-range weighting. In example embodiments, the short and long-range weightings $c_i$ and/or $c_l$ may be obtained by averaging experimental and predicted etch skews that may be obtained from experiment and simulation. The etch skew b may be expressed in nanometers, and the long-range etch skews $Dl(x, y)$ may be expressed in micrometers.

From the equation 3, the etch skew may be expressed in terms of a sum of the short-range etch skews and the long-range etch skew. In addition, from the equation 4, the etch skew may be expressed in terms of a product of the long-range etch skew with a sum of the short-range etch skews. Because the etch bias model may be given in terms of the long-range etch skew, the accuracy can be improved compared with the conventional short-range etch bias model.

In other words, the process proximity correction according to example embodiments of the inventive concepts may be performed using an etch bias model with improved accuracy.

The following equation 5 may be used to represent the short-range etch skews Di.

$$D_i(r_i, \theta_i, x, y) = \iint G_i(r_i, \theta_i) \times A_i(r_i, \theta_i) dr d\theta \quad \text{[Equation 5]}$$

where $Di(ri, \theta i, x, y)$ represents a short-range etch skew obtained in a region spanning from a reference point 50 at a point with coordinates x and y to an edge of the neighboring region S. The neighboring region S may be confined by a circle spanning a region affected by the etching process and having its center at the reference point 50. A radius r of the neighboring region S may be set, within a range of 1-1000 nm, experimentally or empirically by a user or interface. The radius ri may be given in order of nanometer. $Gi(ri, \theta i)$ may represent a short-range layout density, a visible area V, or a block area B, which may be dependent on radius ri and azimuth θi in the neighboring region S. $Ai(ri, \theta i)$ may represent first to third short-range kernel functions corresponding the function $Gi(ri, \theta i)$. In example embodiments, the first to third short-range kernel functions may be expressed in terms of a Gaussian distribution function or a circle function.

The visible area V, the block area B, or the short-range layout density may be given in terms of the short-range etch skew Di(ri, θi, x, y) by convolution with the first to third short-range kernel function. For example, the visible area V may be an area of a region in the neighboring region S, which can be spanned through a radial projection from the reference point 50. The first short-range etch skew D1(r1, θ1, x, y) may be obtained by a convolution of the visible area G1(r1, θ1) with the first short-range kernel function A1(r1, θ1). In addition, the block area B may be an area occupied by the polygonal patterns 20 in the neighboring region S. The second short-range etch skew D2(r2, θ2, x, y) may be obtained by a convolution of G2(r2, θ2) for the block area B with the second short-range kernel function A2(r2, θ2). The short-range layout density may be represented in terms of a ratio in area of the polygonal patterns 20 to the neighboring region S. The third short-range etch skew D3(r3, θ3, x, y) may be obtained by a convolution of the short-range layout density G3(r3, θ3 ) with the third short-range kernel function A3(r3, θ3). The first to third short-range etch skews may be added, as expressed by the equations 3 and 4. As a result, the short-range etch skews Di(ri, θi, x, y) may be represented with polar coordinates (ri, θi) in nanometers.

Meanwhile, the short-range layout density, the visible area, and the block area may be dependent on the radius ri and the azimuth θi. As described above, the first to third short-range kernel functions may be represented in terms of a Gaussian function, a normal distribution function, a circle function, or an exponential function, expressed in terms of variables ri and θi. In the case where a distance considered in the calculation is increased, it may take an excessively long time to calculate the short-range etch skews Di(ri, θi, x, y). Because the short-range etch skews Di(ri, θi, x, y) are calculated by the convolution, a relatively long time may be required to finish the calculation in consideration of the long-range layout density. For example, in the case where the short-range etch skews Di(ri, θi, x, y) are calculated in nanometers, the calculation may not be effectively performed for a region beyond 1 micrometer or more.

The long-range etch skews may be calculated with rectangular coordinates in micrometers. The long-range etch skew may be obtained by convolution of the long-range kernel function with the long-range layout density. The long-range kernel function may be given in micrometers. The long-range etch skews may enable to improve accuracy of the etch bias model. Because the calculation of the long-range etch skews is performed in micrometers, the calculation can be relatively rapidly finished compared with that of the short-range etch skews in nanometers. As a result, the process proximity correction can have the increased productivity.

Referring back to FIGS. 1 and 4, the etch bias model may be used to perform the process proximity correction on all of the polygonal patterns 20 in the target layout 100 (in S700).

Because the process proximity correction is performed using information on the long-range etch skew, generating an etch bias model with relatively high accuracy and improved productivity thereof may be possible.

According to example embodiments of the inventive concepts, each etch skew in the etch bias model may be given in terms of combination of the short-range and long-range etch skews. The short-range etch skews may be obtained by a convolution of the short-range layout density with the short-range kernel function, which may be performed in the neighboring region around the reference point. The short-range kernel function may be represented in terms of a Gaussian function, a normal distribution function, or a circle function. The short-range kernel function may be calculated, in nanometers, from the short-range etch skew using polar coordinates.

The long-range etch skews may be obtained by a convolution of the long-range layout densities with the PSF for the grid cells that are divided, in long range, from the target layout. The PSF may be obtained by comparing the long-range layout densities of the test patterns, to which an etching process has been performed. The PSF may enable a prediction of a change of the long-range etch skew over the long-range layout density for each of the grid cells. The PSF may be given in terms of a long-range kernel function, for example, a non-Gaussian function or abnormal distribution function. The PSF may be used to calculate the long-range etch skews in micrometers. The long-range etch skews may enable to improve accuracy of the etch bias model. Because the calculation of the long-range etch skews is performed in micrometers, the calculation can be relatively rapidly finished compared with that of the short-range etch skews in nanometers. As a result, the process proximity correction can have increased productivity.

While example embodiments of the inventive concepts have been particularly shown and described, it will be understood by one of ordinary skill in the art that variations in form and detail may be made therein without departing from the spirit and scope of the attached claims.

What is claimed is:

1. A method for process proximity correction, the method comprising:
    obtaining a point spread function (PSF) from test patterns, the test patterns including an etching process performed thereon;
    generating a target layout with polygonal patterns;
    dividing the target layout into grid cells;
    generating a density map including long-range layout densities, each of the long-range layout densities being obtained from the polygonal patterns located within a corresponding one of the grid cells;
    performing a convolution of the long-range layout densities with the PSF to obtain long-range etch skews for the grid cells; and
    generating an etch bias model including short-range etch skews and the long-range etch skews, each of the short-range etch skews being obtained from a neighboring region of a target pattern selected from the polygonal patterns in each of the grid cells; and
    performing the process proximity correction on the target layout using the etch bias model in order to design a photomask layout.

2. The method of claim 1, wherein the generating the density map generates raster densities in the density map.

3. The method of claim 1, wherein the obtaining obtains the PSF in terms of a long-range kernel function.

4. The method of claim 3, wherein the obtaining obtains the long- range kernel function in terms of at least one of a non-Gaussian function and an abnormal distribution function.

5. The method of claim 4, wherein
    the obtaining includes calculating the long-range kernel function in micrometers, and
    the generating the density map includes calculating the long-range layout densities in micrometers.

6. The method of claim 1, wherein the generating the etch-bias model includes obtaining the short-range etch skews by convolution of short-range layout densities with a short-range kernel function in the neighboring region of the target pattern.

7. The method of claim 6, wherein the generating the etch-bias model includes obtaining the short-range layout densities and the short-range kernel function in nanometers.

8. The method of claim 6, wherein the generating the etch-bias model includes obtaining the short-range kernel function in terms of at least one of a Gaussian function, a normal distribution function, and a circle function.

9. The method of claim 6, wherein the obtaining the short-range etch skews includes performing a convolution of the short-range kernel function with one of a visible area and a block area.

10. The method of claim 1, wherein the dividing divides each of the grid cells to be larger than the neighboring region of the target pattern.

11. The method of claim 1, wherein the generating the etch bias model further comprises:
    selecting the target pattern for each of the grid cells;
    selecting a reference point from an edge of the target pattern;
    setting the reference point at a center of the neighboring region;
    obtaining a short-range etch skew in the neighboring region; and
    obtaining an etch skew based on a combination of the short-range etch skew and the long-range etch skew.

12. A method for process proximity correction, the method comprising:
    obtaining a point spread function (PSF) from test patterns;
    generating a target layout with polygonal patterns;
    dividing the target layout into grid cells;
    generating a density map including long-range layout densities;
    performing a convolution of the long-range layout densities with the PSF to obtain long-range etch skews for the grid cells, the long-range etch skews being calculated in micrometers; and
    generating an etch bias model including short-range etch skews and the long-range etch skews; and
    performing the process proximity correction on the target layout using the etch bias model in order to design a photomask layout.

13. The method of claim 12, wherein the obtaining obtains the PSF in terms of a long-range kernel function.

14. The method of claim 13, wherein the obtaining obtains the long-range kernel function in terms of at least one of a non-Gaussian function and an abnormal distribution function.

15. The method of claim 12, wherein the generating the etch-bias model includes obtaining the short-range etch skews by convolution of short-range layout densities with a short-range kernel function in the neighboring region of the target pattern.

16. The method of claim 15, wherein the generating the etch-bias model includes obtaining the short-range layout densities and the short-range kernel function in nanometers.

* * * * *